United States Patent [19]

Welch

[11] 4,285,710
[45] Aug. 25, 1981

[54] CRYOGENIC DEVICE FOR RESTRICTING THE PUMPING SPEED OF SELECTED GASES

[75] Inventor: Kimo M. Welch, Mountain View, Calif.

[73] Assignee: Varian Associates, Inc., Palo Alto, Calif.

[21] Appl. No.: 943,276

[22] Filed: Sep. 18, 1978

[51] Int. Cl.³ .............................................. F25J 1/02
[52] U.S. Cl. ........................................ 62/40; 62/12; 55/82
[58] Field of Search ..................... 55/82, 80, 355, 383, 55/418; 62/12, 42, 40, 93, 92

[56] References Cited

U.S. PATENT DOCUMENTS

| 3,192,730 | 7/1965 | Webb | 62/42 |
| 3,194,054 | 7/1965 | Deaton et al | 62/12 |
| 3,250,079 | 5/1966 | Davis et al. | 62/40 |
| 3,517,521 | 6/1970 | Emerson | 62/42 |
| 3,792,591 | 2/1974 | Collins | 62/12 |
| 4,065,277 | 12/1977 | Dahlem | 55/418 |

OTHER PUBLICATIONS

Variflow Automatic Gas Flow Control System, Varian Palo Alto Vacuum Division, Instruction Manual, May 1977, all pages.

*Primary Examiner*—Norman Yudkoff
*Attorney, Agent, or Firm*—Stanley Z. Cole; Leon F. Herbert

[57] ABSTRACT

In an apparatus for removing a selected first gas from a chamber at a controllably variable pumping speed while maintaining a substantially constant pumping speed for removing a second gas from the same chamber, a flow restricting device is disposed between the chamber and a device that pumps the first gas. The flow restricting device comprises a stationary member having an apertured portion through which the first gas can flow from the chamber to the pumping device. Restriction of the flow of the first gas to the pumping device is accomplished by covering the apertured portion of the stationary member with a movable member to the extent necessary to provide the desired pumping speed for the first gas. The stationary member is maintained at a cryogenic temperature higher than the condensation temperature of the first gas, but at a value at which the second gas condenses. In one embodiment, the stationary member is maintained at the desired cryogenic temperature by being mounted in intimate thermal contact with a cryogenic fluid reservoir. In an alternative embodiment, the stationary member is mounted in intimate thermal contact with the warmer stage of a two-stage cryogenic pump.

10 Claims, 5 Drawing Figures

CRYOGENIC DEVICE FOR RESTRICTING THE PUMPING SPEED OF SELECTED GASES

BACKGROUND OF THE INVENTION

This invention is a further development in the field of cryogenic pumping, and in particular provides a controllably variable pumping speed for a selected gas from a chamber to be evacuated while maintaining a substantially constant pumping speed for a different gas having a higher condensation temperature than the gas whose pumping rate is to be varied.

The invention finds particular application in sputtering systems in which it is advantageous to be able to vary the speed at which a gas such as argon can be removed from the sputtering chamber while maintaining a constant pumping speed for water vapor.

In the prior art, it was known to use a throttling valve disposed in a coupling structure between the chamber to be evacuated and a pump that removes the gas whose pumping speed is to be varied. By controlling the opening and closing of the throttling valve, the speed at which the selected gas (e.g., argon) was removed from the chamber could be controlled. However, this throttling technique, while providing the desired pumping speed for the particular gas of concern, also affected the pumping speed of other gases in the chamber (e.g., water vapor).

It was likewise known in the prior art to dispose a liquid nitrogen cooled Chevron baffle or other type of cold trap in the flow path from the chamber being evacuated to the throttling valve. However, the liquid nitrogen reservoir was disposed upstream of the throttling valve in the prior art.

SUMMARY OF THE INVENTION

It is an object of this invention to provide a restricted pumping speed, either fixed or controllably variable, for a selected gas from a chamber to be evacuated, while also providing a substantially constant pumping speed for a different gas from the chamber. In particular, in sputtering applications, it is an object of this invention to provide a controllably variable pumping speed for argon from a sputtering chamber while providing a substantially constant pumping speed for water vapor.

A further object of this invention is to provide a restricted pumping speed for a selected gas from a chamber to be evacuated, while providing a means for removing a different gas from the chamber by cryocondensation on a surface that is maintained at a temperature higher than the condensation temperature of the gas whose pumping speed is to be restricted.

Another object of this invention is to provide a flow restricting device in the passageway from a chamber to be evacuated to a pumping device that can remove a selected gas from the chamber. The flow restricting device is maintained at a cryogenic temperature above the condensation temperature of the selected gas, whereby any gas that cryocondenses at the temperature of the flow restricting device can be pumped on the surface thereof.

In the preferred embodiment, the flow restricting device of this invention provides a controllably variable speed for the selected gas from the chamber to the pumping device. The pumping speed of the gas that cryocondenses on the flow restricting device is unimpeded by the flow restricting device and is substantially independent of the pumping speed of the selected gas whose pumping speed is determined by the flow restricting device.

Yet another object of the present invention is to provide a fixed or controllably variable flow restricting device through which a first gas can flow at a desired speed from a chamber to a pumping device, where the flow restricting device is maintained at a cryogenic temperature at which a second gas condenses, whereby the second gas can be removed from the chamber at a substantially constant pumping speed by cryocondensation on the surface of the flow restriction device, while control can be maintained over the pumping speed of the first gas.

A controllably variable flow restricting device according to the present invention comprises an apertured stationary member that is maintained at a selected cryogenic temperature for pumping a particular gas on the surface thereof at a uniform pumping speed, and a movable member disposed to cover the apertured portion of the stationary member to the extent necessary to provide the desired pumping speed of flow therethrough for the selected gas that is not removed on the surface of the flow restricting device.

In the preferred embodiment, a controllably variable flow restricting device according to the present invention comprises a stationary member having apertures thereon and a movable member mounted on the stationary member so as to cover (and thereby thottle) the apertures on the stationary member to any desired extent. In a particular embodiment, the stationary member is a circular plate having apertures disposed symmetrically thereon, and the movable member is a fan-like structure mounted for rotation about an axis perpendicular to the plane of the stationary member at the center thereof. The movable member is configured to cover the apertures in the stationary member completely when the movable member is rotated to a position at which the desired pumping speed for the selected gas approaches zero. The pumping speed for any gas that cryocondenses on the flow restricting device is substantially constant and is not appreciably affected by the extent to which the apertures in the movable member are opened. By rotating the movable member from the position of near zero pumping speed for the selected gas, through intermediate positions, to a fully opened position at which the speed for the selected gas from the chamber to the pumping device is a maximum, it is possible to achieve controlled variability for the pumping speed of the selected gas.

In one embodiment of this invention, the flow restricting device is mounted in intimate thermal contact with a cryogenic fluid reservoir. The cryogenic fluid (e.g., liquid nitrogen or Freon) cools the walls of a vacuum envelope surrounding the device that pumps the selected gas passing through the flow restricting device, thereby maintaining the vacuum envelope at a cryogenic temperature at which thermal radiation to the pumping device is substantially precluded. The pumping device may be a cryogenic pump that removes the selected gas by the processes of cryocondensation and/or cryosorption, or it may be a diffusion pump or a turbomolecular pump.

In another embodiment, the flow restricting device is mounted in intimate thermal contact with the warmer stage of a two-stage cryogenic pump. The colder stage of the two-stage cryogenic pump is the pumping device that removes the selected gas from the chamber at a

DESCRIPTION OF PREFERRED EMBODIMENT

Figure 1:
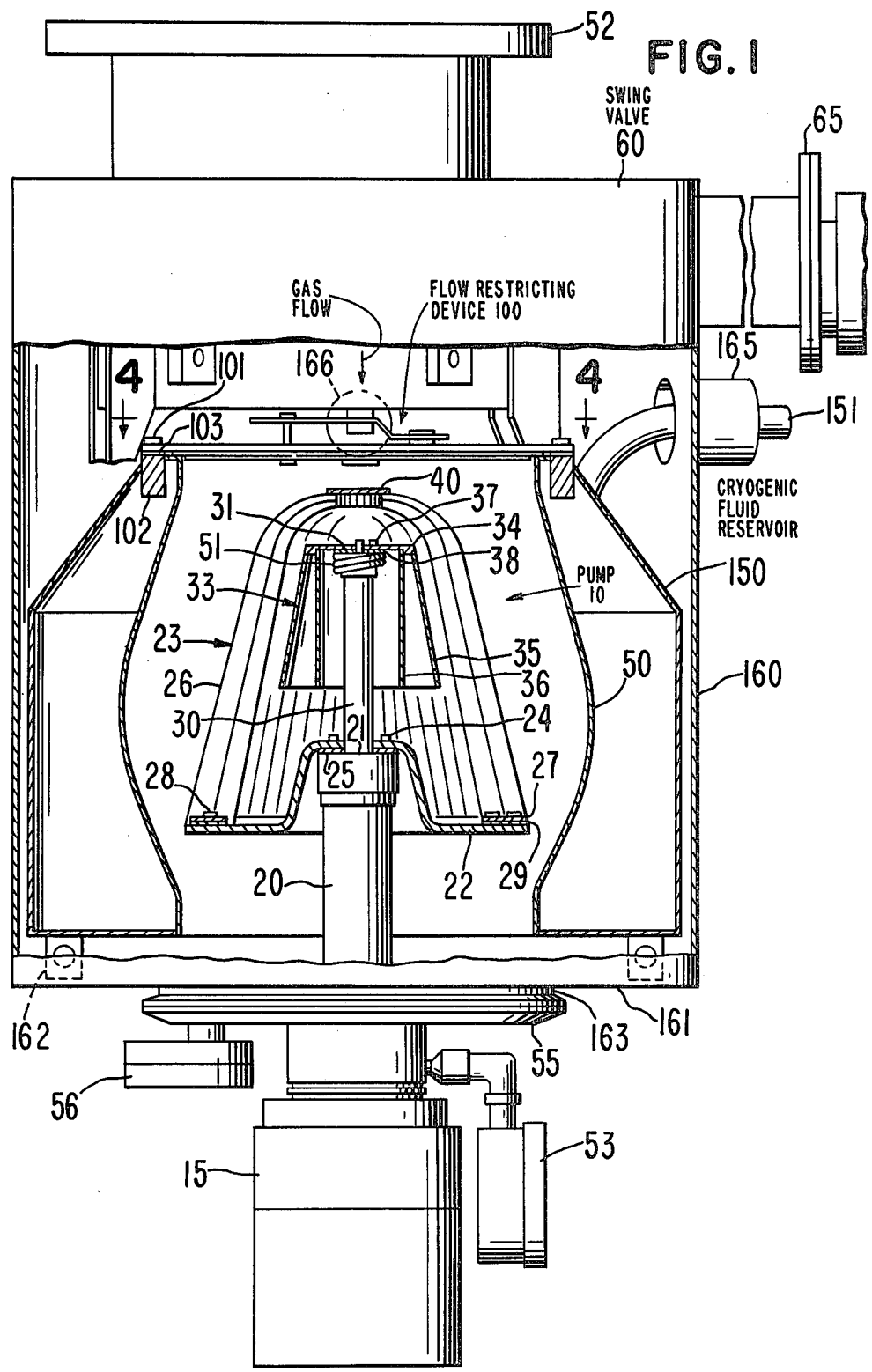
FIG. 1 is a cross-sectional view, partly schematic, of a pumping apparatus comprising a flow restricting device mounted in intimate thermal contact with a cryogenic fluid reservoir, with a two-stage cryogenic pump for removing gas passing through the flow restricting device.

A cross-sectional view, partly schematic, is shown in FIG. 1 of an apparatus for removing a first gas from a chamber at a controllably variable pumping speed, while maintaining a substantially constant pumping speed for removing a second gas from the chamber. In a particular application, the chamber to be evacuated is a sputtering chamber, and the gas to be removed at a controllably variable pumping speed is argon while the gas for which a substantially constant pumping speed is to be maintained is water vapor.

As shown in FIG. 1, a two-stage cryogenic pumping apparatus 10, of the kind disclosed in co-pending U.S. patent application Ser. No. 930,953 filed on Aug. 4, 1978, can be coupled to a chamber to be evacuated in order to remove gases from the chamber by the processes of cryocondensation and cryosorption.

The pumping apparatus 10 operates in combination with a closed-loop refrigeration system in which compressed helium gas is allowed to expand in two successive stages. In the embodiment shown in FIG. 1, a two-stage expander 15 forms an integral part of the pumping system 10, while a compressor unit in which the helium gas is compressed is located remote from the pumping apparatus 10. In certain commercially available cryogenerator systems, however, the compressor unit could be integral with the expander 15. The first-stage expansion of helium gas occurs in an expansion chamber 20 of the expander 15, and thereby causes the distal end wall 21 of the expansion chamber 20 to assume a desired first-stage cryogenic temperature. Typically, this first-stage temperature is selected to be in the 50°0 K. to 80° K. range. The second-stage expansion of the helium gas occurs in an expansion chamber 30, and thereby causes the distal end wall 31 of the expansion chamber 30 to assume a desired colder second-stage cryogenic temperature. Typically, the second-stage temperature is selected to be in the 10° K. to 20° K. range. The temperatures attainable at the first and second refrigeration stages are determined by the parameters of the refrigeration system.

The expansion chambers 20 and 30 are of generally cylindrical configuration, and are disposed adjacent one another along a common axis. The expansion chamber 20 has a broader diameter than the adjacent expansion chamber 30, and thus the exterior surface of the end wall 21 of the expansion chamber 20 provides an annular shelf surrounding the junction of the two expansion chambers. An aluminum support structure 22 is affixed by bolts 24 to this annular shelf on the end wall 21, and an array 23 of first-stage cryopumping surfaces is mounted on the support structure 22. Intimate thermal contact between the support structure 22 and the end wall 21 is provided by a layer of indium foil 25 compressed therebetween. Plastic deformation of the indium foil 25 occurs when the bolts 24 are tightened, thereby causing indium to flow so as to fill whatever crevices or cavities might exist between the support structure 22 and the end wall 21. Alternatively, the support structure 22 could be secured to the end wall 21 by brazing.

The support structure 22 is configured to skirt a portion of the expansion chamber 20 in the axial dimension, so that the perimeter of the support structure 22 is not co-planar with the end wall 21. The cryopumping surfaces of the array 23 are mounted adjacent the perimeter of the support structure 22, and thus have a longer longitudinal extension projected along the axis of the expansion chambers 20 and 30 than would be possible if the support structure 22 were to extend laterally in the same plane as the end wall 21.

The array 23 comprises a plurality of elongate baffles 26 made of copper or other material of high thermal conductivity. Each of the baffles 26 is made from a strip of material that is folded along a longitudinal crease into the configuration of an angle iron having a lateral cross-section shaped like a chevron. Alternatively, such a chevroned baffle could be fabricated from separate strips of material joined edge-to-edge to form a structure having the configuration of an angle iron. The lateral extension of the arms of the cross-sectional chevron varies uniformly along the length of each baffle from a maximum at the bottom end adjacent the support structure 22 to a minimum at the top end.

The bottom ends of the baffles 26 are mounted around the perimeter of a planar mounting ring 27, and are preferably evenly spaced from each other. Each baffle 26 is separated from the adjacent baffles on either side thereof, yet adjacent baffles are nested within each other so that line-of-sight passage of gas molecules and thermal radiation into the interior of the array 23 is impossible through the space between any two adjacent baffles. The bottom end of each baffle 26 in contact with the surface of the mounting ring 27 is angled so that each baffle 26 leans inwardly toward the axis of the expansion chambers 20 and 30. The mounting ring 27 is affixed to the perimeter of the support structure 22 by bolts 28. Intimate thermal contact between the mounting ring 27 and the support structure 22 is provided by a layer of indium foil 29 compressed therebetween.

Near the top end, each baffle 26 is arcuately bent inward toward the axis of the expansion chambers 20 and 30 for attachment to a retaining member 40, which serves to maintain uniform spacing between the baffles 26 while holding them in a generally conical configuration. In the preferred embodiment, the mounting ring 27 is a planar ring and the retaining member 40 is a disc. Both the ring 27 and the disc 40 are preferably made of copper. The resulting three-dimensional array 23 of first-stage pumping surfaces is thus of generally conical configuration enclosing a volume within which a second-stage pumping structure 33 is mounted on the end wall 31 of the expansion chamber 30.

It is advantageous for the chevroned baffles 26 to be blackened so as to intercept all thermal radiation from external sources and to prevent reflection of thermal radiation between adjacent baffles 26 to the second-stage pumping structure 33. Blackening of the baffles 26 can be accomplished chemically, as by oxidation, or by use of a light-absorbent paint.

The first-stage array 23 of chevroned baffles 26, together with the bottom support structure 22 and the top retaining disc 40, surround the second-stage pumping structure 33 mounted on the end wall 31 of the expansion chamber 30. The second-stage pumping structure 33 is configured to present as large a surface area as practicable to gas species entering the interior of the first-stage array 23 through the spaces between adjacent chevroned baffles 26. For this reason, the configuration of the exterior surface of the second-stage pumping structure 33 conforms generally to the silhouette of the array 23 of chevroned baffles 26 of the surrounding first-stage pumping structure. Thus, where the first-stage array 23 has a generally conical configuration, a frustroconical configuration is suitable for the exterior of the second-stage pumping structure 33.

The second-stage pumping structure 33 comprises a plate 34 affixed to and extending beyond the perimeter of the end wall 31 of the expansion chamber 30, a hollow frustroconical member 35 affixed to the plate 34 so as to skirt a portion of the expansion chamber 30, and a hollow cylindrical member 36 affixed to the plate 34 so as to skirt the expansion chamber 30 within the interior of the frustroconical member 35. Preferably, the cylindrical member 36 and the surrounding frustroconical member 35 are coaxially disposed with respect to each other. The plate 34, the frustroconical member 35, and the cylindrical member 36 are all preferably of copper, and are assembled by brazing or soldering to form a unitary structure. The plate 34 is affixed to the end wall 31 of the expansion chamber 30 by bolts 37. Intimate thermal contact between the plate 34 and the end wall 31 is provided by a layer of indium foil 38 compressed therebetween.

The exterior surface of the frustroconical member 35 and the exterior surface of the plate 34 are preferably highly reflective, as by being nickel plated, to prevent absorption of thermal radiation. The inner surfaces of the second-stage pumping structure 33 (i.e., the interior surface of the plate 34, the interior surface of the frustroconical member 35, and both the inner and outer walls of the cylindrical member 36) are preferably coated with a cryosorbent material such as activated charcoal or artificial zeolite. The effective surface area of activated charcoal is on the order of hundreds of square meters per gram, so that a coating of activated charcoal greatly increases the cryosorption capability of the second-stage pumping structure 33.

A capillary tube 51 filled with hydrogen gas extends from a position in intimate thermal contact with the distal end 31 of the second-stage expansion chamber 30 to a hydrogen vapor pressure gauge 53 located remote from the expansion chamber 30. At operating temperatures of the second-stage pumping structure 33, the vapor pressure of hydrogen gas varies montonically and predictably with temperature. Thus, measurement of the hydrogen pressure in the capillary tube 51 provides a direct indication of the temperature at the distal end of the expansion chamber 30, and therefore of the temperature of the second-stage pumping structure 33 in intimate thermal contact therewith.

The first-stage pumping array 23 of chevroned baffles and the second-stage pumping structure 33 are mounted within a generally cylindrical gas-tight vacuum envelope 50, which defines the region in which the selected gas is pumped. In order to provide maximum unobstructed transmission to the array 23 of first-stage pumping surfaces for the gas entering the vacuum envelope 50, the envelope 50 is configured to preclude constriction of the gas flow passageway. Thus, the envelope 50 is preferably bulged radially outward from true cylindrical configuration in the vicinity of the first-stage array 23. A gap is provided between the support structure 22 and the envelope 50 so that ices and other debris can fall to the bottom of the pumping apparatus 10 and not form a solid "bridge" that might serve as a thermal short between the first-stage pumping surfaces 26 and the envelope 50.

As shown in FIG. 1, the vacuum envelope 50 serves as the interior wall of a cryogenic fluid reservoir 150 that surrounds the two-stage cryogenic pumping device comprising the first-stage pumping array 23 and the second-stage pumping structure 33. Gas flow from the chamber being evacuated enters the interior of the vacuum envelope 50 through a flow restricting device 100 that is secured to the top of the cryogenic fluid reservoir 150 by screws 101 that are received in threaded sockets 102 welded to the reservoir 150 in a symmetric pattern around the perimeter of the top portion thereof. The cryogenic fluid reservoir 150 is filled via a tube 151 extending from a source of cryogenic fluid to a port (not shown) in the reservoir 150. The cryogenic fluid is typically liquid nitrogen; however, any refrigerant that can be maintained at the cryogenic temperature desired for the flow restricting device 100 could be used. For example, the cryogenic fluid could be one of the mixed chlorofluoromethanes such as the refrigerants commercially available under the Freon trademark.

Indium washers 103 are disposed between the flow restricting device 100 and the sockets 102 whereby intimate thermal contact can be maintained between the flow restricting device 100 and the cryogenic fluid reservoir 150. In this way, the temperature of the flow restricting device 100 can be maintained substantially at the temperature of the cryogenic fluid in the reservoir 150. In operation, the temperature of the cryogenic fluid is selected so that the flow restricting device 100 can be maintained at a temperature below the condensation temperature of the gas that is to be pumped thereon by cryocondensation (e.g., water vapor), but above the condensation temperature of the selected gas (e.g., argon).

The pumping apparatus 10 and its surrounding cryogenic fluid reservoir 150 are enclosed within a housing structure 160 that is of generally cylindrical configuration with a planar bottom wall 161 upon which a plurality of thermally insulating support structures 162 are mounted. The cryogenic fluid reservoir 150 is supported upon the support structures 162 in such a way as to provide a thermally insulating gap between the outer walls of the reservoir 150 and the inner walls of the housing structure 160. This insulating gap serves to isolate the reservoir 150 from ambient sources of thermal energy. The tube 151 through which the reservoir 150 is filled with cryogenic fluid passes through a port 165 in a side wall of the housing structure 160. A vacuum seal is made on the periphery of the tube 151 to provide gas-tight integrity of the housing structure 160.

A flanged port 163 is provided in the bottom wall 161 of the housing structure 160. This port 163 is covered by a matingly flanged cap structure 55 that closes and hermetically seals the housing structure 160. The expander 15 extends through an aperture in the cap structure 55 into the interior of the vacuum envelope 50. A weld joint seals the expander 15 at the periphery where it passes through the aperture in the cap structure 55, whereby gas-tight integrity of the cap structure 55 sealing the housing structure 160 is maintained. A flanged roughing port 56 may also be provided in the cap structure 55.

Figure 2:
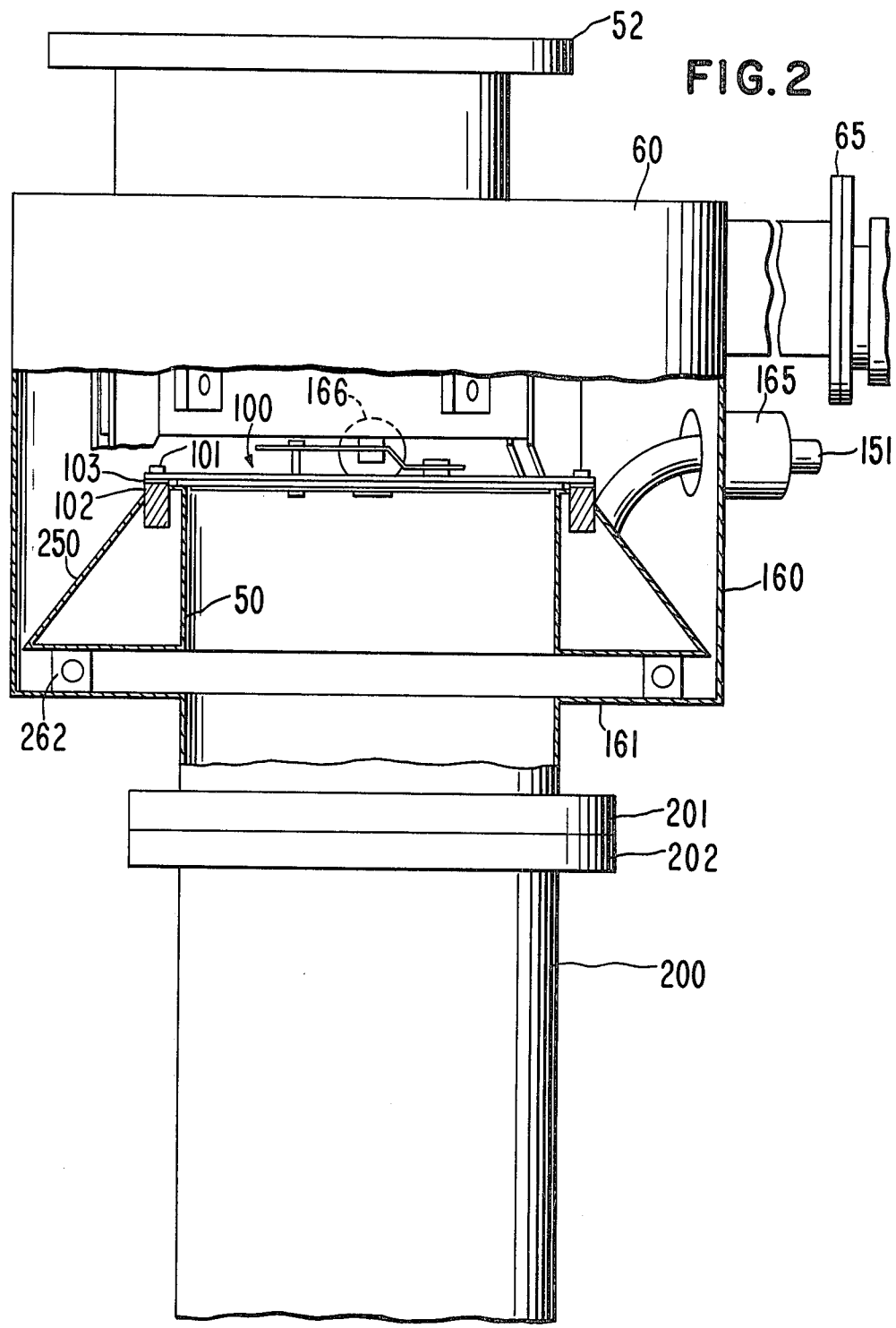
FIG. 2 is a cross-sectional view, partly schematic, of a pumping apparatus comprising a flow restricting device mounted in intimate thermal contact with a cryogenic fluid reservoir, with a pumping device such as a diffusion pump or a turbomolecular pump for removing gas passing through the flow restricting device.

An alternative embodiment of a pumping apparatus according to the present invention is shown in FIG. 2 in which the pumping device for removing the selected first gas (e.g., argon) is a diffusion pump or a turbomolecular pump, rather than a cryogenic pump as in FIG. 1. As shown in FIG. 2, gas flow from the chamber to be evacuated enters the interior of the vacuum envelope 50 through the same kind of flow restricting device 100 as shown in FIG. 1. However, in FIG. 2, instead of a cryogenic pump being disposed within the interior of the vacuum envelope 50, a pumping device 200, such as a diffusion pump or a turbomolecular pump, is coupled to the housing structure 160 for removing gas that passes through the flow restricting device 100. As shown in FIG. 2, the bottom wall 161 of the housing structure 160 is provided with a flanged port 201, which mates with a flange 202 on the diffusion pump, or turbomolecular pump, 200.

The flow restricting device 100 is in intimate thermal contact with a cryogenic fluid reservoir 250, and can thereby be maintained at a cryogenic temperature suitable for removing a gas (e.g., water vapor) for which a substantially constant pumping speed is desired.

In each of the embodiments shown, respectively, in FIGS. 1 and 2, the top of the cylindrical housing structure 160 is a generally planar member having a flanged port 52 for vacuum-tight coupling with a mating flange in the wall of the chamber to be evacuated. A number of vacuum-tight flange arrangements known to those skilled in the vacuum art are possible for the flange indicated by reference number 52. For example, see U.S. Pat. No. 3,208,758, assigned to Varian Associates, Inc.

In many applications, it is desirable to interpose a valve between the chamber being evacuated and the interior of the housing structure 160. In the embodiments shown in FIGS. 1 and 2, a swing valve 60 is provided to open and close the port 52 leading from the chamber being evacuated to the interior of the housing structure 160. The swing valve 60 (shown diagrammatically) can be actuated mechanically, hydraulically, pneumatically, or by solenoid means coupled to a linkage device passing through a flanged port structure 65 in the cylindrical sidewall of the housing structure 160.

In operation, when the swing value 60 is open, gas from the chamber being evacuated passes therethrough to the flow restricting device 100. In a typical application where it is desired to regulate the speed at which argon is pumped from a sputtering chamber while maintaining a constant pumping speed for water vapor, the temperature of the flow restricting device 100 is maintained at a value below the condensation temperature of water vapor but above the condensation temperature of argon.

The flow restricting device 100 is apertured to permit the passage therethrough of gas at not less than a desired minimum pressure. For certain applications, the apertured portion of the flow restricting device 100 may suitably be non-variable, being of a size sufficient to prevent swamping of the pumping device during removal of gas that does not cryocondense on the flow restricting device 100. In the preferred embodiment, however, the flow restricting device 100 comprises means for controllably varying the aperture size through which gas from the chamber may pass. Hereinafter, the flow restricting device 100 will therefore be described as a variable aperture device.

When the apertures on the flow restricting device 100 are completely covered, the pumping speed for gas that does not cryocondense on the surface thereof effectively approaches zero. The passage of such gas to the pumping device via the restrictive space between the inside wall of the housing structure 160 and the outside wall of the cryogenic fluid reservoir (designated by reference number 150 in FIG. 1 and 250 in FIG. 2) is neglible because of the close proximity of the reservoir to the housing structure wall.

The size of the apertured portion of the flow restricting device 100 is continuously variable from a fully throttled position to a fully opened position. When the apertured portion of the flow restricting device 100 is fully closed, gases such as water vapor (i.e., gases having a relatively high condensation temperature) are pumped by cryocondensation on the upper surface thereof. When the apertured portion is opened to any intermediate extent, gases that are not cryocondensed on the flow restricting device 100 pass therethrough to the interior of the vacuum envelope 50. At the fully opened position, the pumping rate for all gases that do not cryocondense on the flow restricting device 100 is a maximum. However, the rate at which gases such as water vapor are pumped on the surface of the flow restricting device 100 is not appreciably affected by whether the apertures are opened or closed.

In the embodiment shown in FIG. 1, gases that do not cryocondense on the flow restricting device 100 are pumped on the surfaces of the first-stage pumping array 23, or on the colder surfaces of the second-stage pumping structure 33. In the embodiment shown in FIG. 2, such gases are removed by the pumping device 200. Water vapor that enters through the apertured portion of the flow restricting device 100 can be pumped on the inside surface thereof, as well as on the inside wall of the vacuum envelope 50.

Figure 3:
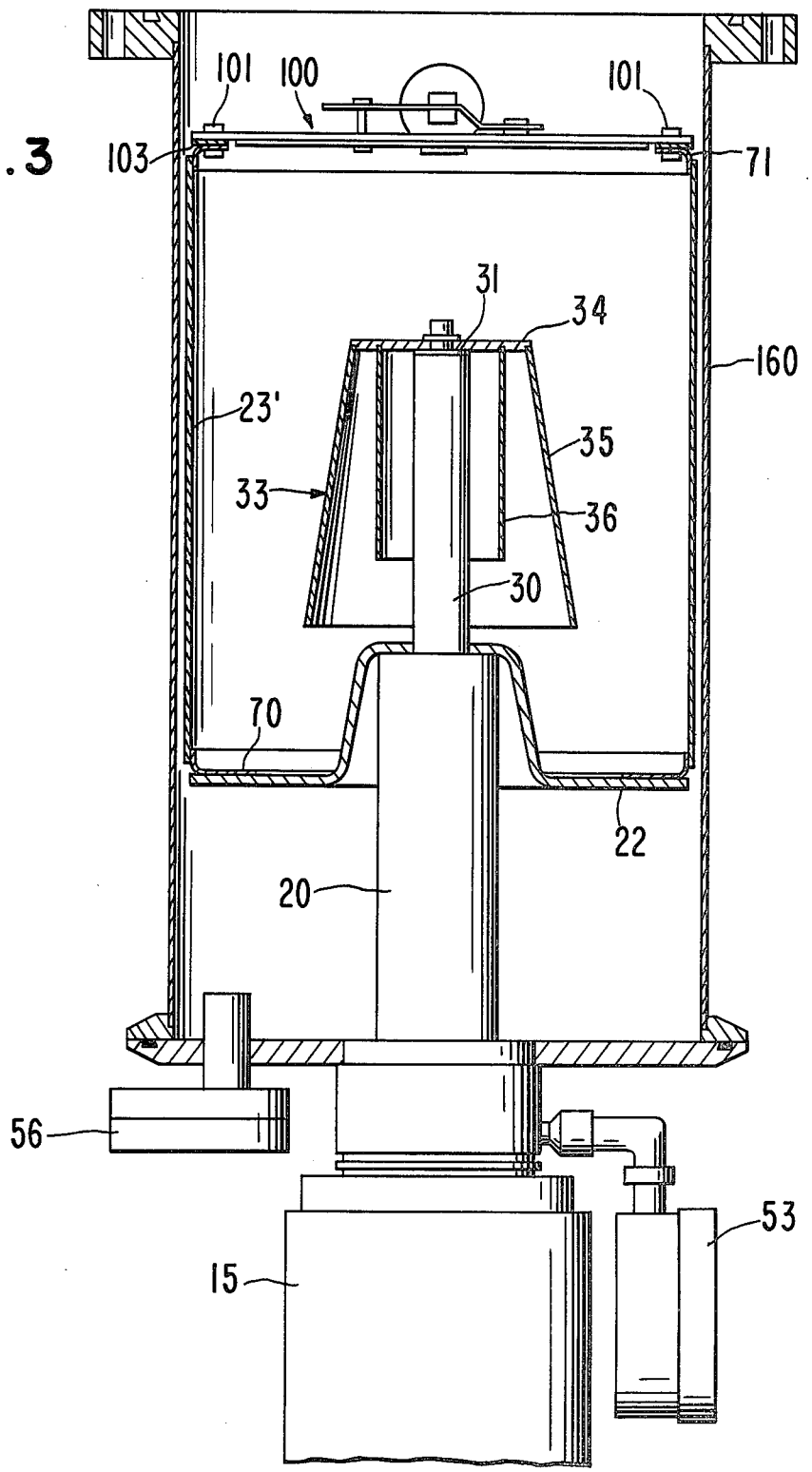
FIG. 3 is a cross-sectional view, partly schematic, of a pumping apparatus comprising a flow restricting device mounted in intimate thermal contact with the warmer stage of a two-stage cryogenic pump, with the colder stage of the two-stage cryogenic pump serving to remove gas passing through the flow restricting device.

Another alternative embodiment of a pumping apparatus according to the present invention is shown in FIG. 3, wherein the flow restricting device 100 is mounted directly on the first (i.e, warmer) stage of a two-stage cryogenic pumping apparatus. As shown in FIG. 3, a two-stage expander 15 comprises a first-stage expansion chamber 20 and a second-stage expansion chamber 30, just as in the embodiment shown in FIG. 1. An aluminum support structure 22 for supporting a first-stage pumping structure is affixed to the distal end wall 21 of the expansion chamber 20, and a second-stage pumping structure 33 is affixed to the distal end wall 31 of the expansion chamber 30, just as in FIG. 1. The second-stage pumping structure 33 shown in FIG. 3 may be substantially identical to the corresponding second-stage pumping structure shown in FIG. 1. However, the first-stage pumping structure shown in FIG. 3 differs from the first-stage pumping structure shown in FIG. 1 in that, in place of the array 23 of chevroned baffles shown in FIG. 1, a generally cylindrical pumping structure 23' is affixed in intimate thermal contact to the support structure 22 to form a first-stage cryogenic pumping surface within the housing structure 160.

As shown in FIG. 3, a cup-like annular member 70, preferably of copper, forms the means whereby the bottom end of the cylindrical pumping structure 23' is affixed to the support structure 22. The member 70 has an L-shaped cross section, the horizontal arm of which may be brazed or bolted to the support structure 22, and the vertical arm of which is brazed to the cylindrical structure 23'. In a similar manner, the vertical arm of an inverted cup-like annular member 71 is brazed to the top end of the cylindrical pumping structure 23'. The flow restricting device 100 is affixed to the horizontal arm of the annular member 71 by means of bolts 101. Intimate thermal contact between the flow restricting device 100 and the inverted cup-like annular member 71 is provided by indium washers 103 disposed therebetween around the bolts 101. In this way, the flow restricting device 100 assumes the cryogenic temperature of the first-stage pumping structure 23'.

A feature of the present invention is that a means is provided for maintaining the temperature of the apertured flow restricting device 100 at a cryogenic temperature lower than the condensation temperature of a gas (e.g., water vapor) for which a constant pumping speed is desired, yet at a temperature above the condensation temperature of a selected gas (e.g, argon) for which a restricted pumping speed is desired. Controlled variation in the pumping speed of this selected gas may be provided by a means for throttling the apertured portion of the flow restricting device 100.

Figure 4:
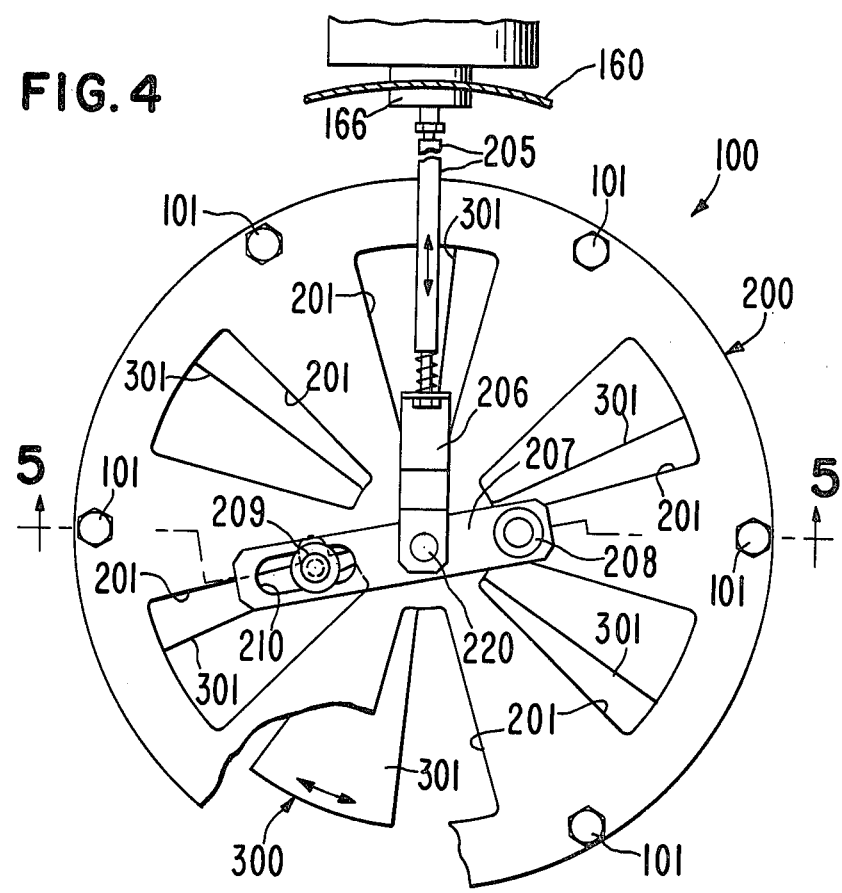
FIG. 4 is a view of a variable aperture flow restricting device according to the present invention taken along line 4—4 of FIG. 1.

FIG. 4 provides a view of a variable aperture flow restricting device 100 of the present invention taken along line 4—4 of FIG. 1. The variable aperature device 100 comprises an apertured stator plate 200 that, in the embodiment shown in FIG. 1, is generally circular and is affixed in intimate thermal contact to the circular periphery of the cryogenic fluid reservoir 150 by the bolts 101 and the indium washers 103. In the embodiment shown in FIG. 2, the stator plate 200 is similarly bolted to the periphery of the cryogenic fluid reservoir 250. In the embodiment shown in FIG. 3, the stator plate 200 is bolted to the inverted cup-like annular structure 71 that is brazed to the upper end of the cylindrical first-stage cryogenic pumping structure 23'.

Figure 5:
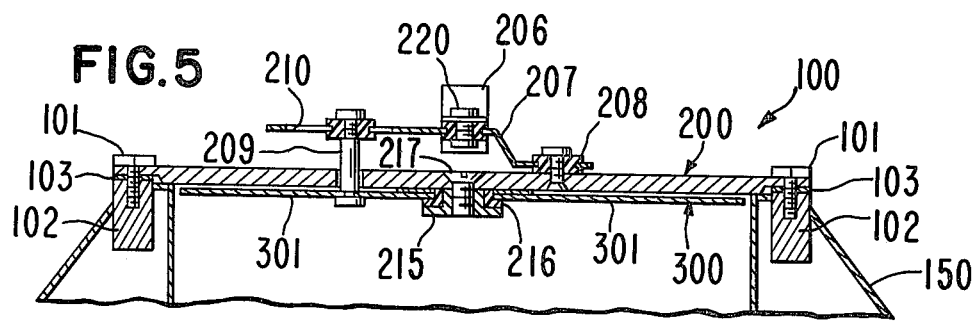
FIG. 5 is a view of a variable aperture flow restricting device according to the present invention taken along line 5—5 of FIG. 4.

The stator plate 200 has a plurality of apertures 201 disposed symmetrically thereon. Preferably, the apertures 201 are configured as truncated equilateral triangles with bases and tops defined by radii of curvature with origin at the center of the plate 200. A rotor 300 is mounted on the underside of the stator plate 200 for rotation about an axis perpendicular to the plate 200 at the center thereof. As shown in FIG. 5, this mounting is accomplished by means of a container nut 215 and Teflon (i.e., polytetrafluoroethylene) sleeve bearing 216 secured by a flathead screw 217 at the center of the plate 200.

The rotor 300 is configured so as to mask completely the apertures 201 in the stator plate 200 when rotated to the fully closed position. For the apertures 201 configured as shown in FIG. 4, the rotor 300 may suitably comprise fan-like blades 301 that are generally of the same configuration but slightly larger than the apertures 201. An actuating rod 205 is provided for rotating the blades 301 about the axis of the stator plate 200. Translational adjustment of the actuating rod 205 provides the desired rotational positioning of the blades 301 with respect to the apertures 201. Positioning of the blades 301 with respect to the apertures 201 affords the desired restriction in pumping speed. The actuating rod 205 passes into the interior of the housing structure 160 through a port 166. Vacuum sealing for the actuating rod 205 may be provided by a sealed bellows within the port 166. Translational motion may be imparted to the actuating rod 205 by mechanical, hydraulic, pneumatic or solenoid means in accordance with techniques well-known to those skilled in the art.

As shown in FIG. 5 the actuating rod 205 is attached to a connecting linkage 206, which in turn is attached by a pin 220 to a rotor actuating bracket 207. One end of the bracket 207 pivots about a bearing 208 that is affixed eccentrically on the stator plate 200. A rotor actuating pin 209 is affixed at one end thereof to one of the rotor blades 301. The other end of the rotor actuating pin 209 is received with a slot 210 at the end of the bracket 207 opposite the pivot bearing 208. In this way, translational motion of the actuating rod 205 is converted into rotational motion of the rotor blades 301. The desired amount of closure of the apertures 201 by the blades 301 is obtained by adjusting the actuating rod 205.

This invention has been described above in connection with a number of preferred embodiments. Other techniques for maintaining the flow restricting device at a desired cryogenic temperature may suggest themselves to practioners skilled in the art, and are accordingly within the scope of this invention. Furthermore, alternative techniques for controllably varying the aperture size of the flow restricting device may also suggest themselves to those skilled in the art, and accordingly would be within the scope of this invention. Thus, the foregoing description is to be construed as illustrative rather than limiting, and the invention is defined in terms of the following claims.

What is claimed is:

1. Apparatus for removing a first gas from a chamber at a pumping speed which can be varied over a substantial range while removing a second gas from the chamber at a relatively more constant speed, said apparatus comprising conduit means forming a gas flow path and having an inlet opening adapted to communicate with the chamber from which gas is to be pumped, flow restricting means within said conduit means and exposed to gas entering said inlet opening, pumping means for pumping gas which passes through said restricting means, said restricting means being positioned between said pumping means and said inlet opening;

said restricting means comprising stationary wall means positioned across said gas flow path and having solid portions and apertured areas, movable closure means having a plurality of closure segments positioned adjacent said stationary wall means, means for moving said segments toward and away from a position in which said segments cooperate with said stationary solid portions to substantially prevent gas flow through said restricting means, cooling means, structural connecting means interconnecting said stationary wall means and said cooling means and forming a high thermal conductivity path between said stationary wall means and said cooling means, said structural interconnecting means being distinct from said conduit means, and said movable closure means being connected to said stationary wall means by structural connecting means which are distinct from said conduit means.

2. The apparatus of claim 1 wherein said stationary wall means is positioned between said movable closure means and said inlet opening.

3. The apparatus of claim 2 wherein said stationary wall means comprises a planar disk in which said apertured areas are formed, and said movable closure means comprises a planar rotor having blades which form said closure segments.

4. The apparatus of claim 1 wherein said cooling means is one stage of a multi-stage cryogenic pump, said one stage of said multi-stage pump being maintained at a temperature higher than the condensation temperature of said first gas but having a temperature at which said second gas condenses, another stage of said multi-stage pump being maintained at a temperature at which said first gas condenses.

5. The apparatus of claim 1 wherein said cooling means comprises a fluid reservoir surrounding said pumping means.

6. The apparatus of claim 5 wherein said pumping means is a multi-stage cryogenic pump.

7. The apparatus of claim 6 wherein said cryogenic pump comprises a first stage cryogenic pumping surface positioned first in the flow of gas passing through said restricting means and a second stage cryogenic pumping surface positioned second in the flow of gas passing through said restricting means, means for maintaining said second stage pumping surface at a lower temperature than said first stage pumping surface, and said fluid reservoir is spaced outwardly from said first stage pumping surface.

8. The apparatus of claim 7 wherein said stationary wall means is positioned between said movable closure means and said inlet opening.

9. The apparatus of claim 8 wherein said stationary wall means comprises a planar disk in which said apertured areas are formed, and said movable closure means comprises a planar rotor having blades which form said closure segments.

10. The apparatus of claim 1 wherein said moving means moves said closure segments along a path which is substantially parallel to the adjacent surfaces of said solid portions of the stationary wall means.

* * * * *